United States Patent
Cheng et al.

(10) Patent No.: US 8,325,126 B2
(45) Date of Patent: Dec. 4, 2012

(54) LIQUID CRYSTAL DISPLAY WITH REDUCED IMAGE FLICKER AND DRIVING METHOD THEREOF

(75) Inventors: Hsiao-Chung Cheng, Hsin-Chu (TW); Chao-Ching Hsu, Hsin-Chu (TW); Mu-Lin Tung, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 437 days.

(21) Appl. No.: 12/647,560

(22) Filed: Dec. 28, 2009

(65) Prior Publication Data

US 2010/0315322 A1    Dec. 16, 2010

(30) Foreign Application Priority Data

Jun. 15, 2009   (TW) ................................ 98119919 A

(51) Int. Cl.
   *G09G 3/36*   (2006.01)
(52) U.S. Cl. .......................................... 345/99; 345/95
(58) Field of Classification Search .................... 345/90, 345/99, 204, 95, 210
   See application file for complete search history.

(56) References Cited

U.S. PATENT DOCUMENTS

| | | | |
|---|---|---|---|
| 6,927,755 B2 * | 8/2005 | Chang | 345/101 |
| 7,027,024 B2 | 4/2006 | Yanagi | |
| 2005/0035958 A1 * | 2/2005 | Moon | 345/204 |
| 2006/0044042 A1 * | 3/2006 | Kim | 327/403 |
| 2008/0192038 A1 * | 8/2008 | Liu et al. | 345/206 |
| 2008/0225035 A1 | 9/2008 | Hsu | |
| 2009/0009497 A1 * | 1/2009 | Lee et al. | 345/205 |
| 2009/0189883 A1 * | 7/2009 | Chung et al. | 345/213 |
| 2012/0069682 A1 * | 3/2012 | Joo | 365/185.25 |

FOREIGN PATENT DOCUMENTS

TW    I253051    4/2006

* cited by examiner

*Primary Examiner* — Chanh Nguyen
*Assistant Examiner* — Kwang-Su Yang
(74) *Attorney, Agent, or Firm* — Winston Hsu; Scott Margo

(57) ABSTRACT

A liquid crystal display includes a gate driver, a control circuit and a charge-sharing circuit. The control circuit provides a charge-sharing signal according to the parasitic capacitances at a first output end and a second output end in the gate driver. The charge-sharing circuit generates a third clock signal and a fourth clock signal by performing charge-sharing on a first clock signal and a second clock signal according to the charge-sharing signal. The third clock signal includes a signal falling edge which descends from a high level to a first level, and the fourth clock signal includes a signal falling edge which descends from the high level to a second level. The gate driver outputs a first gate driving signal and a second gate driving signal respectively at the first and the second output end according the third or the fourth clock signal.

13 Claims, 5 Drawing Sheets

LIQUID CRYSTAL DISPLAY WITH REDUCED IMAGE FLICKER AND DRIVING METHOD THEREOF

BACKGROUND OF THE INVENTION

1. Field of the Invention

The present invention is related to a liquid crystal display device, and more particularly, to a liquid crystal display device capable of improving image flicker.

2. Description of the Prior Art

Liquid crystal display (LCD) devices, characterized in low radiation, small size and low power consumption, have gradually replaced traditional cathode ray tube (CRT) displays and been widely used in various electronic products, such as notebook computers, personal digital assistants (PDAs), flat panel TVs, or mobile phones.

FIG. 1 is a diagram illustrating a prior art LCD device 100. The LCD device 100 includes a source driver 110, a gate driver 120, a timing controller 130, a plurality of data lines $DL_1$-$DL_m$, a plurality of gate lines $GL_1$-$GL_n$, and a pixel matrix. The pixel matrix includes a plurality of pixel units PX each having a thin film transistor (TFT) switch, a liquid crystal capacitor $C_{LC}$ and a storage capacitor $C_{ST}$, and respectively coupled to a corresponding data line, a corresponding gate line and a common voltage $V_{com}$. The timing controller 130 can generate control signals for operating the source driver 110 and the gate driver 120, such as a start pulse signal VST and clock signals CK, XCK. The source driver 110 can generate data driving signals $SD_1$-$SD_m$ corresponding to display images. The gate driver 120 includes a plurality of shift register units $SR_1$-$SR_n$ and having output ends $OUT_1$-$OUT_n$ coupled to the corresponding gate lines $GL_1$-$GL_n$, respectively. According to the clock signals CK, XCK and the start pulse signal VST, the gate driver 120 sequentially outputs the gate driving signals $SG_1$-$SG_n$ for turning on the TFT switches. In order to provide sufficient driving, the shift register units $SR_1$-$SR_n$ normally adopt large-size output TFT switches.

FIG. 2 is a diagram of a prior art LCD device 200. The LCD device 200 includes a source driver 210, a gate driver 220, a timing controller 230, a charge-sharing circuit 240, a plurality of data lines $DL_1$-$DL_m$, a plurality of gate lines $GL_1$-$GL_n$, and a pixel matrix. The pixel matrix includes a plurality of pixel units PX each having a TFT switch, a liquid crystal capacitor $C_{LC}$ and a storage capacitor $C_{ST}$, and respectively coupled to a corresponding data line, a corresponding gate line and a common voltage $V_{com}$. The timing controller 230 can generate control signals for operating the source driver 210 and the gate driver 220, such as a start pulse signal VST, clock signals CK, XCK, and an output enable signal OE. The source driver 210 can generate data driving signals $SD_1$-$SD_m$ corresponding to display images. The charge-sharing circuit 240 can perform charge-sharing on the clock signals CK and XCK according to the output enable signal OE, thereby generating corresponding clock signals O_CK and O_XCK. The gate driver 220 includes a plurality of shift register units $SR_1$-$SR_n$ having output ends $OUT_1$-$OUT_n$ respectively coupled to the corresponding gate lines $GL_1$-$GL_n$. According to the clock signals CK, XCK and the start pulse signal VST, the gate driver 220 sequentially outputs the gate driving signals $SG_1$-$SG_n$ for turning on the TFT switches. In order to provide sufficient driving, the shift register units $SR_1$-$SR_n$ normally adopt large-size output TFT switches, and the values of parasitic capacitance at the output ends $OUT_1$-$OUT_n$ are represented by $C_1$-$C_n$, respectively.

In the prior art LCD devices 100 and 200, the parasitic capacitance of the output ends $OUT_1$-$OUT_n$ of the gate driver 120 or 220 may differ, resulting in different amount of RC loading for the gate driving signals $SG_1$-$SG_n$. This kind of gate pulse distortion largely influences the display quality.

SUMMARY OF THE INVENTION

The present invention provides a liquid crystal display device comprising a gate driver, a control circuit and a charge sharing circuit. The gate driver outputs a first gate driving signal and a second gate driving signal according to a first clock signal or a second clock signal, and comprises a first output end for outputting the first gate driving signal and a second output end for outputting the second gate driving signal. The control circuit provides a charge sharing signal according to parasitic capacitances at the first and second output ends of the gate driver, and provides a third clock signal and a fourth clock signal, wherein the third and fourth clock signals periodically switch polarities and have opposite polarities at the same time. The charge sharing circuit generates the first and second clock signals by performing charge sharing on the third and fourth clock signals according to the charge sharing signal, wherein the first clock signal includes a signal falling edge which descends from a high voltage level to a first voltage level, and the second clock signal includes a signal falling edge which descends from the high voltage level to a second voltage level.

The present invention also provides a method for driving a liquid crystal display device comprising providing a first clock signal and a second clock signal, wherein the first and second clock signals periodically switch polarities and have opposite polarities at the same time; determining a first time length according to a parasitic capacitance at a first output end; determining a second time length according to a parasitic capacitance at a second output end; providing a third clock signal by performing charge-sharing on the first and second clock signals during a period corresponding to the first output end, wherein the third clock signal includes a signal falling edge which descends from a high voltage level to a first voltage level; and providing a fourth clock signal by performing charge-sharing on the first and second clock signals during a period corresponding to the second output end, wherein the fourth clock signal includes a signal falling edge which descends from a high voltage level to a second voltage level.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
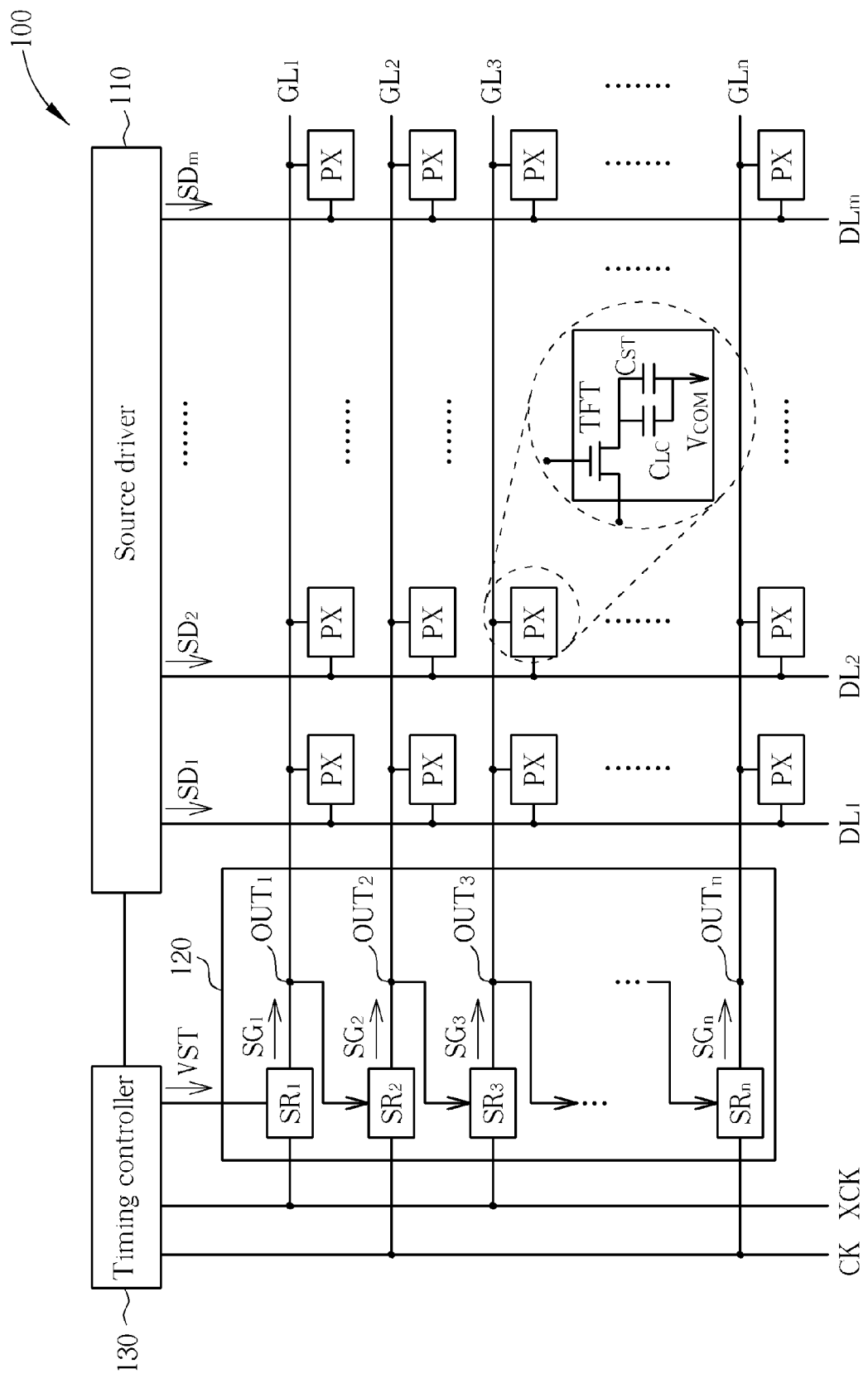
FIG. 1 is a diagram illustrating a prior art LCD device.
Figure 2:
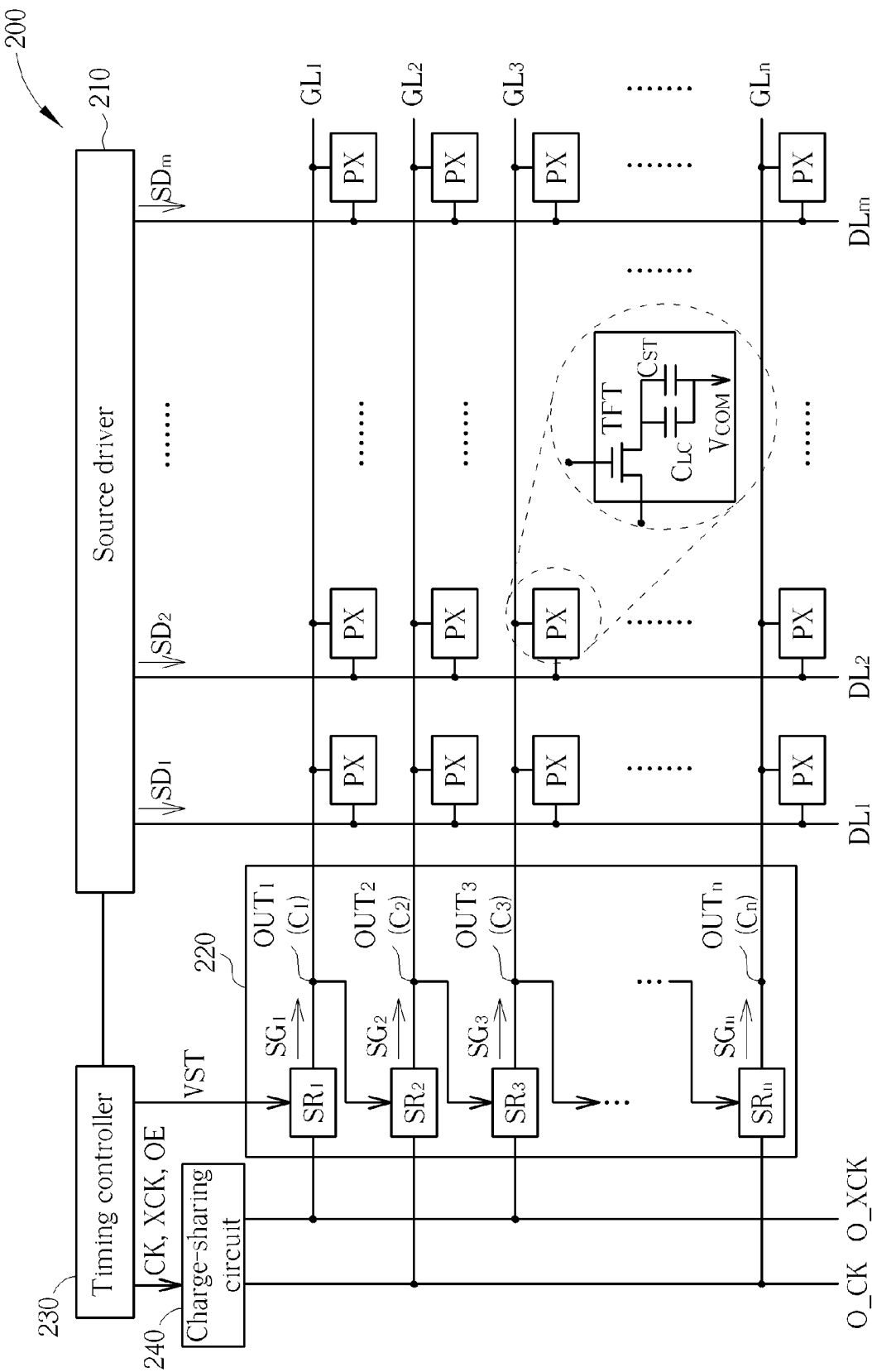
FIG. 2 is a diagram illustrating another prior art LCD device.
Figure 3:
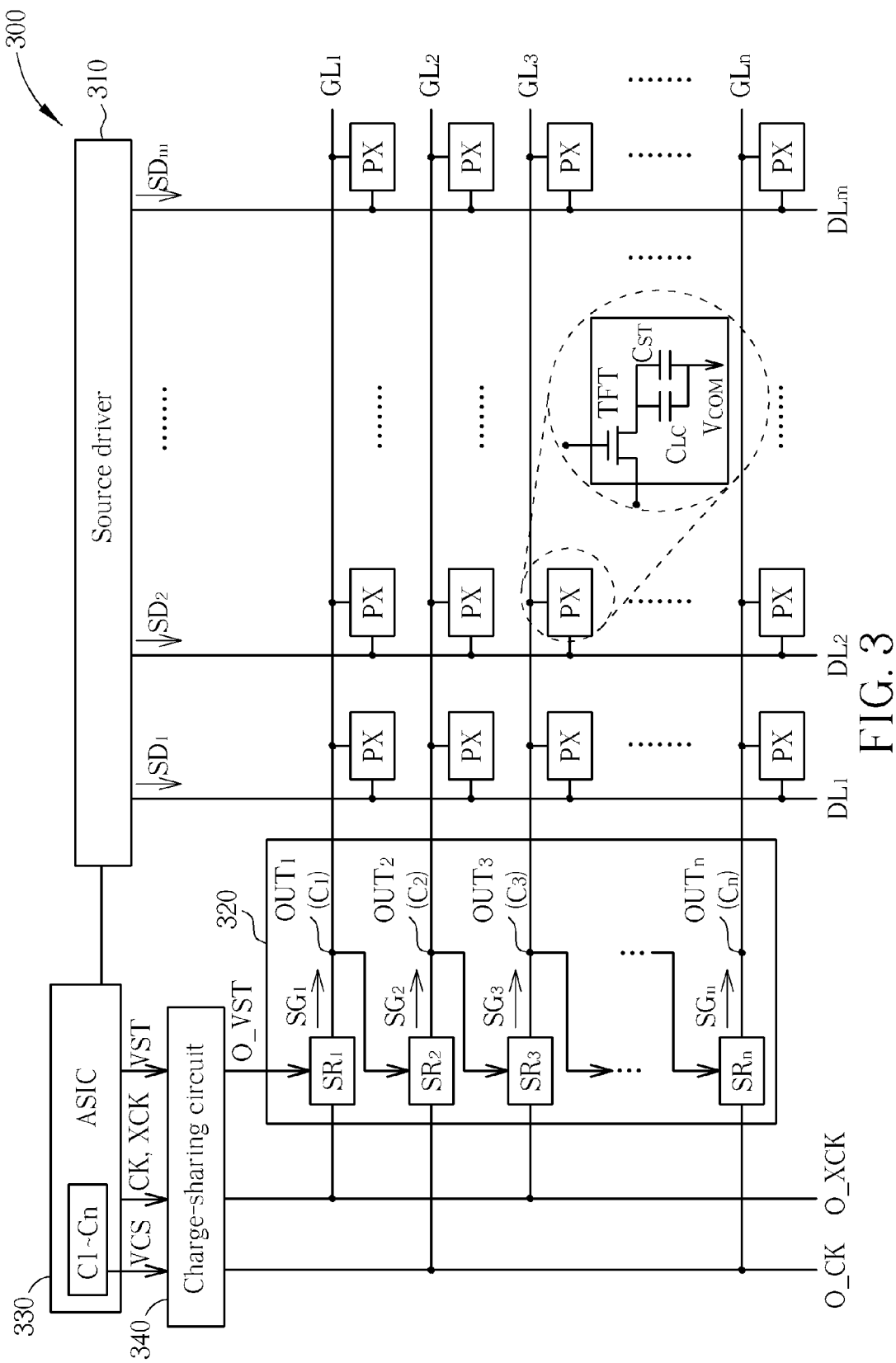
FIG. 3 is a diagram illustrating an LCD device according to the present invention.

In traditional LCD devices, external source drivers and gate drivers are used for driving the pixels of the panel in order to display images. Recently, a GOA technique has been developed in which the gate driver is directly fabricated on the LCD panel. FIG. 3 is an LCD device 300 which adopts GOA technique according to the present invention. The LCD device 300 includes a source driver 310, a gate driver 320, an application-specific integrated circuit (ASIC) 330, a charge-sharing circuit 340, a plurality of data lines $DL_1$-$DL_m$, a plurality of gate lines $GL_1$-$GL_n$, and a pixel matrix. The pixel matrix includes a plurality of pixel units PX each having a TFT switch, a liquid crystal capacitor $C_{LC}$ and a storage capacitor $C_{ST}$, and respectively coupled to a corresponding data line, a corresponding gate line and a common voltage $V_{com}$. The source driver 310 can generate data driving signals $SD_1$-$SD_m$ corresponding to display images. The gate driver 320 includes a plurality of shift register units $SR_1$-$SR_n$ and having output ends $OUT_1$-$OUT_n$ respectively coupled to the corresponding gate lines $GL_1$-$GL_n$. The ASIC 330 can generate control signals for operating the gate driver 320, such as a start pulse signal VST, clock signals CK, XCK, and a charge-sharing signal VCS. During each output period, the disable time (low voltage level) of the charge-sharing signal VCS is determined by the capacitance of the gate lines $GL_1$-$GL_n$ which respectively correspond to the output ends $OUT_1$-$OUT_n$, that is, by the parasitic capacitance $C_1$-$C_n$ at the output ends $OUT_1$-$OUT_n$. Therefore, the charge-sharing circuit 340 can perform charge-sharing on the clock signals CK and XCK according to the charge-sharing signal VCS, thereby generating corresponding clock signals O_CK and O_XCK. According to the clock signal O_CK or O_XCK, the gate driver 320 sequentially outputs the gate driving signals $SG_1$-$SG_n$ for turning on the TFT switches.

When a TFT switch is turned off, its corresponding pixel electrode is not connected to any power source and thus has a floating level. Any surrounding voltage variation may be coupled to the pixel electrode through its parasitic capacitance, thereby altering the voltage level of the pixel electrode. The voltage applied to the liquid crystal capacitor $C_{LC}$ and the storage capacitor $C_{ST}$ may deviate from the default value. This kind of voltage variation due to parasitic capacitance is called feed-through voltage, whose value $V_{FD}$ can be represented as follows:

$$V_{FD}=[C_{GD}/(C_{LC}+C_{ST}+C_{GD})]*\Delta V_G$$

$C_{GD}$ represents the parasitic capacitance between the gate and drain terminals of the TFT switch, while $\Delta V_G$ represents the gate voltage drop established when the TFT switch is turned off by the gate driving signal. Since parasitic capacitance unavoidably exists in all TFT switches, one common approach for reducing image flicker caused by the feed-through voltage $V_{FD}$ is by lowering the value of the gate voltage drop $\Delta V_G$ before adjusting the common voltage for compensation.

Figure 4:
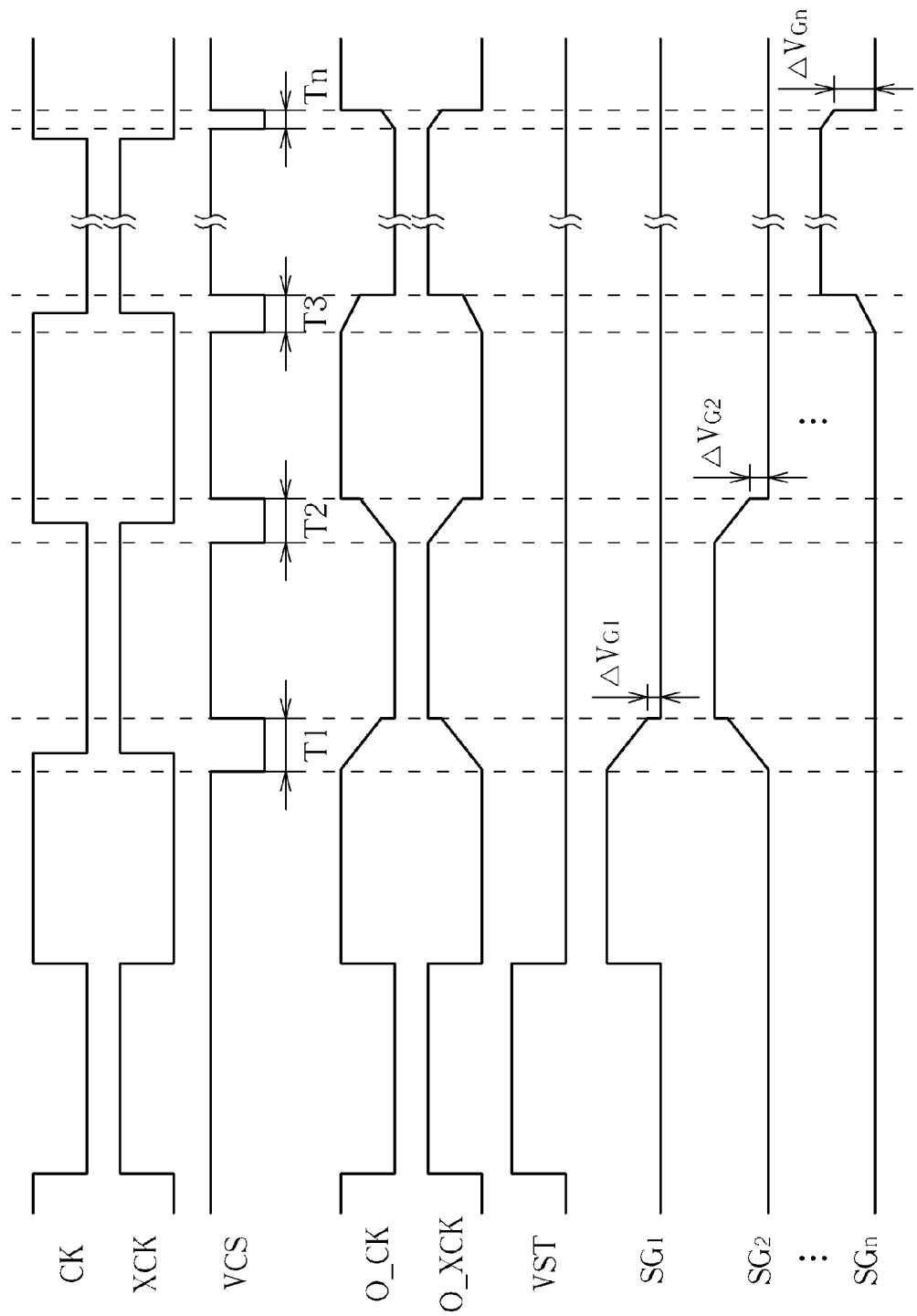
FIG. 4 is a diagram illustrating a method for driving the LCD device in FIG. 3.

FIG. 4 is a diagram illustrating a method for driving the LCD device 300 according to the present invention. FIG. 4 shows the waveforms of the clock signals CK, XCK, O_CK and O_XCK, the charge-sharing signal VCS, and the gate driving signals $SG_1$-$SG_n$. In the method illustrated in FIG. 4, the clock signals CK and XCK having opposite polarities periodically switch between a high voltage level and a low voltage level according to the length of enable period in the gate driving signals $SG_1$-$SG_n$. The ASIC 330 first generate the charge-sharing signal VCS having distinct disable time (low voltage level) T1-Tn according to the parasitic capacitance $C_1$-$C_n$ at the output ends $OUT_1$-$OUT_n$, respectively. When the charge-sharing signal VCS is at high voltage level, the gate driver 320 outputs the clock signals CK and XCK for providing the corresponding clock signals O_CK and O_XCK; when the charge-sharing signal VCS is at low voltage level, the gate driver 320 stops outputting the clock signals CK and XCK and charge-sharing is performed between the clock signals O_CK and O_XCK, thereby achieving voltage-trimming at the signal falling edges. According to the clock signals O_CK and O_XCK, the gate driver 320 then generates the gate driving signals $SG_1$-$SG_n$ having distinct trimmed signal falling edges which respectively correspond to the gate voltage drops $\Delta V_{G1}$-$\Delta V_{Gn}$ established when the clock signals CK and XCK switch voltage levels. As previously stated, the gate driving signals $SG_1$-$SG_n$ encounter more signal delay at the output ends $OUT_1$-$OUT_n$ with increasing stage, which means the relationship of the parasitic capacitance of each stage is $C_1<C_2<\ldots<C_n$. In order to compensate various influence of feed-through voltage caused by different parasitic capacitance, the present invention generates the charge-sharing signal VCS having distinct disable time (low voltage level) T1-Tn respectively according to the parasitic capacitance $C_1$-$C_n$ at the output ends $OUT_1$-$OUT_n$, wherein T1>T2>...>Tn. Therefore, the feed-through voltage of each pixel unit can be equalized when the gate driving signals $SG_1$-$SG_n$ establish the gate voltage drops $\Delta V_{G1}$-$\Delta V_{Gn}$ with the relationship $\Delta V_{G1}<\Delta V_{G2}<\ldots<\Delta V_{Gn}$. Therefore, the present invention can effectively improve image flicker by adjusting the common voltage $V_{com}$.

Figure 5:
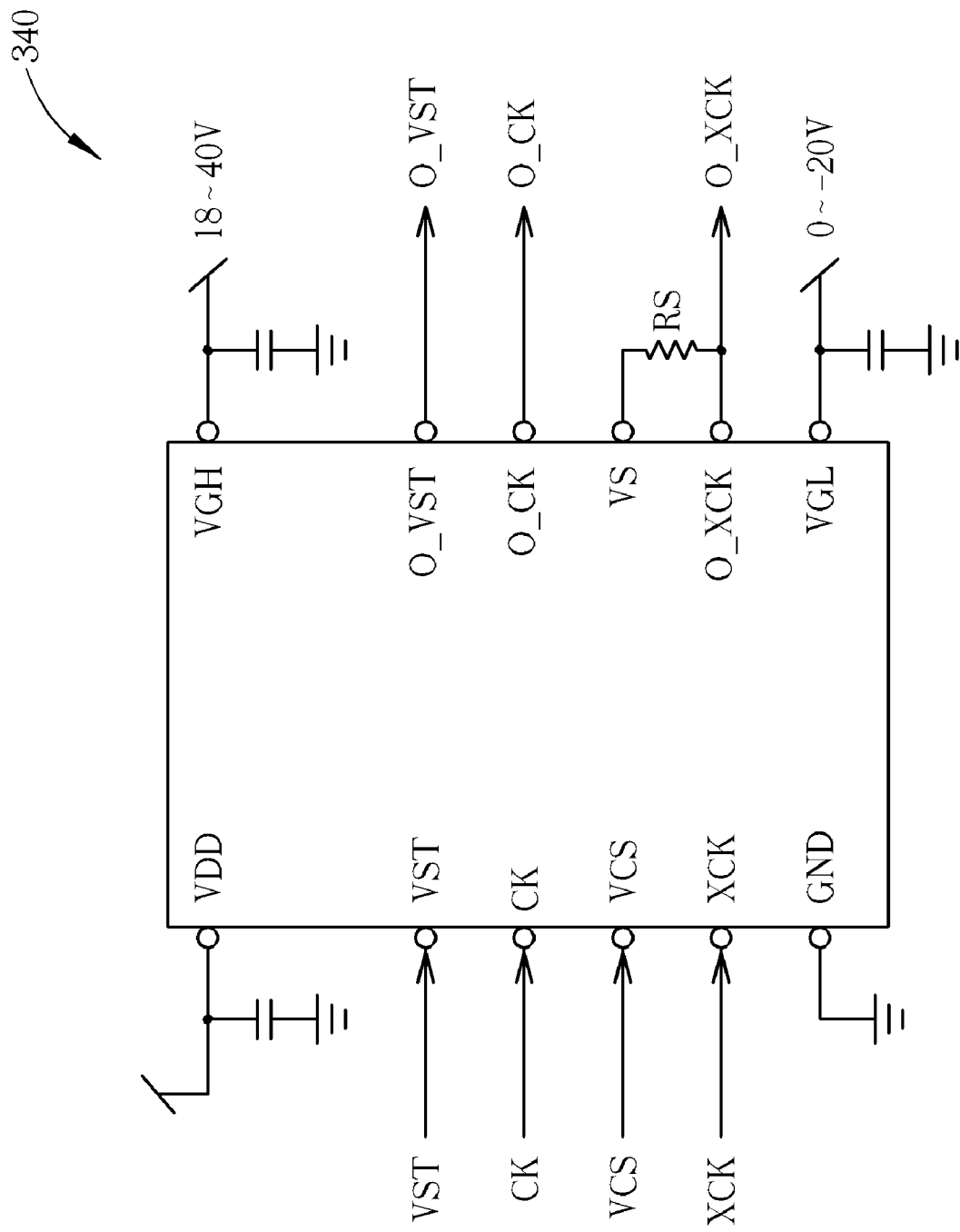
FIG. 5 is a diagram illustrating a charge-sharing circuit according to an embodiment of the present invention.

FIG. 5 is a diagram illustrating the charge-sharing circuit 340 according to an embodiment of the present invention. In this embodiment, the charge-sharing circuit 340 is an integrated circuit capable of receiving or outputting corresponding signals or bias voltages via various pins. For instance, the clock signals O_CK and O_XCK are respectively outputted at the O_CK and O_XCK pins. When the charge-sharing signal VCS is at high voltage level, the charge-sharing circuit 340 outputs the clock signals CK and XCK respectively at the O_CK and O_XCK pins for providing the corresponding clock signals O_CK and O_XCK; when the charge-sharing signal VCS is at low voltage level, the O_CK and O_XCK pins are coupled to each other via the resistor RS and charge-sharing can thus be performed between the clock signals O_CK and O_XCK, thereby achieving voltage-trimming at the signal falling edges. Meanwhile, the charge-sharing circuit 340 can include a level shifter for enlarging the clock signals CK and XCK. The charge-sharing circuit 340 depicted in FIG. 3 is only for illustrative purpose and does not limit the scope of the present invention.

In the present invention, charge-sharing is performed according to the parasitic capacitance at the output end of each stage. The gate driving signals $SG_1$-$SG_n$ establish the gate voltage drops $\Delta V_{G1}$-$\Delta V_{Gn}$ with the relationship $\Delta V_{G1}<\Delta V_{G2}<\ldots<\Delta V_{Gn}$, so as to equalize the feed-through voltage of each pixel unit. As a result, image flicker can be effectively improved by adjusting the common voltage $V_{com}$.

Those skilled in the art will readily observe that numerous modifications and alterations of the device and method may be made while retaining the teachings of the invention.

What is claimed is:
1. A liquid crystal display device comprising:
a gate driver for outputting a first gate driving signal and a second gate driving signal according to a first clock signal or a second clock signal, the gate driver comprising:
a first output end for outputting the first gate driving signal; and
a second output end for outputting the second gate driving signal;
a control circuit configured to:

provide a third clock signal and a fourth clock signal, wherein the third and fourth clock signals periodically switch polarities and have opposite polarities at the same time; and provide a charge sharing signal according to parasitic capacitances at the first and second output ends of the gate driver, the charge-sharing signal including:
a first disable period corresponding to an output period of the first output end; and
a second disable period corresponding to an output period of the second output end;
wherein the parasitic capacitance at the second output end is larger than the parasitic capacitance at the first output end, and the first disable period is longer than the second disable period; and a charge-sharing circuit configured to:
generate the first clock signal by performing charge-sharing on the third and fourth clock signals during the first disable period; and
generate the second clock signal by performing charge-sharing on the third and fourth clock signals during the second disable period;
wherein the first clock signal includes a signal falling edge which descends from a high voltage level to a first voltage level, and the second clock signal includes a signal falling edge which descends from the high voltage level to a second voltage level.

2. The liquid crystal display device of claim 1, wherein a transmission path between the charge-sharing circuit and the second output end of the gate driver is longer than a transmission path between the charge-sharing circuit and the first output end of the gate driver, and the second voltage level is higher than the first voltage level.

3. The liquid crystal display device of claim 1, wherein the second voltage level is higher than the first voltage level.

4. The liquid crystal display device of claim 1, wherein the charge-sharing circuit comprises a level shifter for enlarging the third and fourth clock signals.

5. The liquid crystal display device of claim 1, wherein the charge-sharing circuit comprises:
a first output end for outputting the first clock signal;
a second output end for outputting the second clock signal; and
a resistor coupled between the first and second output ends of the charge-sharing circuit.

6. The liquid crystal display device of claim 1, wherein the gate driver is fabricated using GOA (gate driver on array) technique.

7. The liquid crystal display device of claim 1, wherein the gate driver comprises:
a first shift register unit for supplying the first gate driving signal by outputting the first clock signal; and
a second shift register unit for supplying the second gate driving signal by outputting the second clock signal.

8. The liquid crystal display device of claim 7, wherein the first shift register unit outputs the first gate driving signal using a first thin film transistor (TFT) switch, and the second shift register unit outputs the second gate driving signal using a second TFT switch, and wherein the parasitic capacitance at the first output end of the gate driver is related to a parasitic capacitance contributed by the first TFT switch, and the parasitic capacitance at the second output end of the gate driver is related to a parasitic capacitance contributed by the first and second TFT switches.

9. The liquid crystal display device of claim 1, wherein the control circuit is an application-specific integrated circuit (ASIC).

10. A method for driving a liquid crystal display device comprising:
providing a first clock signal and a second clock signal, wherein the first and second clock signals periodically switch polarities and have opposite polarities at the same time;
providing a charge-sharing signal including a first disable period corresponding to an output period of the first output end and a second disable period corresponding to an output period of the second output end, wherein the parasitic capacitance at the second output end is larger than the parasitic capacitance at the first output end, and the first disable period is longer than the second disable period;
providing a third clock signal by performing charge-sharing on the first and second clock signals during the first disable period, wherein the third clock signal includes a signal falling edge which descends from a high voltage level to a first voltage level; and
providing a fourth clock signal by performing charge-sharing on the first and second clock signals during the second disable period, wherein the fourth clock signal includes a signal falling edge which descends from the high voltage level to a second voltage level.

11. The method of claim 10 further comprising enhancing voltage levels of the first and second clock signals before performing charge-sharing.

12. The method of claim 10 wherein the first and second clock signals perform charge-sharing using a resistor.

13. The method of claim 10 further comprising:
outputting the third clock signal at the first output end during the first disable period; and
outputting the fourth clock signal at the second output end during the second disable period.

* * * * *